(12) United States Patent
Mikajiri

(10) Patent No.: US 9,379,130 B2
(45) Date of Patent: Jun. 28, 2016

(54) NONVOLATILE SEMICONDUCTOR MEMORY DEVICE

(71) Applicant: Kabushiki Kaisha Toshiba, Minato-ku (JP)

(72) Inventor: Yoshimasa Mikajiri, Mie (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/638,312

(22) Filed: Mar. 4, 2015

(65) Prior Publication Data

US 2015/0263031 A1 Sep. 17, 2015

(30) Foreign Application Priority Data

Mar. 13, 2014 (JP) .................................. 2014-050780

(51) Int. Cl.
*H01L 29/792* (2006.01)
*H01L 27/115* (2006.01)
*G11C 16/04* (2006.01)

(52) U.S. Cl.
CPC ...... *H01L 27/11578* (2013.01); *G11C 16/0483* (2013.01); *H01L 27/1157* (2013.01); *H01L 27/11575* (2013.01); *H01L 27/11582* (2013.01)

(58) Field of Classification Search
CPC ................... H01L 27/11578; H01L 27/11582; H01L 27/11573; H01L 29/66833; H01L 29/792; H01L 29/7926
USPC .................................................. 257/324, 326
See application file for complete search history.

(56) References Cited

U.S. PATENT DOCUMENTS

| 7,936,004 | B2 | 5/2011 | Kito et al. |
| 8,372,720 | B2 | 2/2013 | Fukuzumi et al. |
| 8,551,838 | B2 | 10/2013 | Kito et al. |
| 8,569,826 | B2 | 10/2013 | Kidoh et al. |
| 8,729,624 | B2 | 5/2014 | Fukuzumi et al. |
| 8,890,235 | B2 * | 11/2014 | Kidoh ............... H01L 27/11573 257/326 |
| 8,916,926 | B2 * | 12/2014 | Choe ................... H01L 27/1157 257/324 |
| 2007/0252201 | A1 | 11/2007 | Kito et al. |
| 2010/0207195 | A1 | 8/2010 | Fukuzumi et al. |
| 2011/0284947 | A1 | 11/2011 | Kito et al. |
| 2011/0287597 | A1 | 11/2011 | Kito et al. |
| 2011/0309431 | A1 | 12/2011 | Kidoh et al. |

(Continued)

FOREIGN PATENT DOCUMENTS

JP 2009-146954 A 7/2009

*Primary Examiner* — Hung Vu
(74) *Attorney, Agent, or Firm* — Oblon, McClelland, Maier & Neustadt, L.L.P

(57) ABSTRACT

According to one embodiment, a memory device, includes: a stacked body including first electrode layers stacked alternately with first insulating layers; a selection gate stacked body including selection gate electrode layers stacked alternately with second insulating layers in a stacking direction of the stacked body; a semiconductor member provided inside the stacked body and the selection gate stacked body, the semiconductor member extending in the stacking direction; a memory film provided between the semiconductor member and each of the f first electrode layers; and a gate insulator film provided between the semiconductor member and each of the selection gate electrode layers. Selection transistors are provided on the stacked body, the plurality of selection transistors included the selection gate electrode layers, the gate insulator film, and the semiconductor member, at least two of the selection transistors have mutually different threshold potentials.

11 Claims, 6 Drawing Sheets

(56) References Cited

U.S. PATENT DOCUMENTS

| | | |
|---|---|---|
| 2012/0243309 A1 | 9/2012 | Asaoka et al. |
| 2012/0307557 A1 | 12/2012 | Itagaki |
| 2013/0069118 A1 | 3/2013 | Mori |
| 2013/0126961 A1 | 5/2013 | Fukuzumi et al. |
| 2014/0021531 A1 | 1/2014 | Kidoh et al. |
| 2014/0217493 A1 | 8/2014 | Fukuzumi et al. |

* cited by examiner

FIG. 3A

|       | Bias  | Vth  |
|-------|-------|------|
| 454D  | -1V   | 3V   |
| 453D  | -1V   | 2V   |
| 452D  | -1V   | 1.5V |
| 451D  | -1V   | 1V   |
| 43    | 5V    | 1V   |
| 40    | 8V    | —    |

FIG. 3B

|       | Bias  | Vth  |
|-------|-------|------|
| 454D  | -1.5V | 1V   |
| 453D  | -1V   | 1V   |
| 452D  | 0V    | 1V   |
| 451D  | 0.5V  | 1V   |
| 43    | 5V    | 1V   |
| 40    | 8V    | —    |

NONVOLATILE SEMICONDUCTOR MEMORY DEVICE

CROSS-REFERENCE TO RELATED APPLICATIONS

This application is based upon and claims the benefit of priority from Japanese Patent Application No. 2014-050780, filed on Mar. 13, 2014; the entire contents of which are incorporated herein by reference.

FIELD

Embodiments described herein relate generally to a nonvolatile semiconductor memory device.

BACKGROUND

The demand for flash memory as a storage medium is high; and there are expectations for higher bit densities and lower costs. Methods for increasing the bit density include downscaling the minimum patterning dimension of lithography. However, as even higher bit densities continue to be realized by pursuing downscaling technology, it is predicted that such a realization of both increased bit density and reduced costs will become difficult due to the scaling limits of lithography, the increasing difficulty of patterning technology, etc. Therefore, technology is drawing attention in which memory cells are arranged in a three-dimensional configuration.

BRIEF DESCRIPTION OF THE DRAWINGS

FIG. 3A and FIG. 3B show threshold potentials and potentials applied in the off-state for multiple selection transistors according to the embodiment;

DETAILED DESCRIPTION

Figure 1:
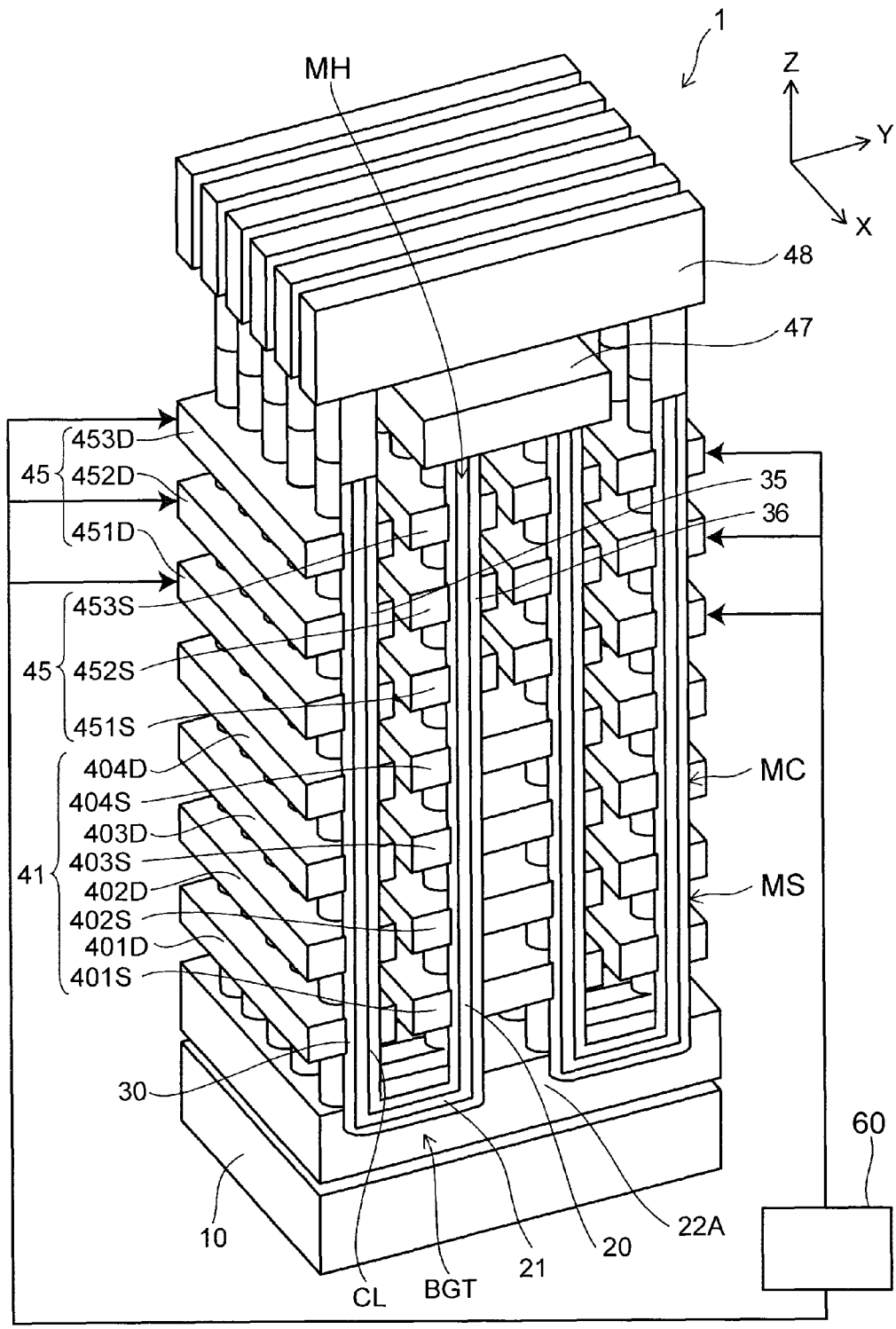
FIG. 1 is a schematic perspective view showing an overview of a memory cell array unit of a nonvolatile semiconductor memory device according to an embodiment.

In general, according to one embodiment, a nonvolatile semiconductor memory device, includes: a foundation layer; a stacked body provided on the foundation layer, the stacked body including a plurality of first electrode layers stacked alternately with a plurality of first insulating layers; a selection gate stacked body provided on the stacked body, the selection gate stacked body including a plurality of selection gate electrode layers stacked alternately with a plurality of second insulating layers in a stacking direction of the stacked body; a semiconductor member provided inside the stacked body and the selection gate stacked body, the semiconductor member extending in the stacking direction; a memory film provided between the semiconductor member and each of the plurality of first electrode layers; and a gate insulator film provided between the semiconductor member and each of the plurality of selection gate electrode layers, the gate insulator film including a charge storage film. A plurality of selection transistors are provided on the stacked body, the plurality of selection transistors included the plurality of selection gate electrode layers, the gate insulator film, and the semiconductor member, at least two of the plurality of selection transistors have mutually different threshold potentials.

Embodiments will now be described with reference to the drawings. In the description hereinbelow, the same members are marked with the same reference numerals; and a description is omitted as appropriate for members once described.

An overview of a nonvolatile semiconductor memory device according to the embodiment will now be described.

FIG. 1 is a schematic perspective view showing an overview of a memory cell array unit of the nonvolatile semiconductor memory device according to the embodiment.

In FIG. 1, the insulating portions other than the insulating film formed on the inner wall of a memory hole MH are not shown for easier viewing of the drawing.

For convenience of description, an XYZ orthogonal coordinate system is introduced in FIG. 1. In the coordinate system, two mutually-orthogonal directions parallel to a major surface of a substrate 10 are taken as an X-direction and a Y-direction; and a direction orthogonal to both the X-direction and the Y-direction is taken as a Z-direction.

The nonvolatile semiconductor memory device 1 is a NAND nonvolatile memory that can freely and electrically erase and program data and retain the memory content even when the power supply is OFF. The nonvolatile semiconductor memory device 1 shown in FIG. 1 is normally called BiCS (Bit Cost Scalable) flash memory.

In the nonvolatile semiconductor memory device 1, a back gate 22A is provided on the substrate 10 via a not-shown insulating layer. The substrate 10 including the insulating layer is called the foundation layer. The substrate 10 is, for example, a silicon substrate. Active elements such as transistors, etc., passive elements such as resistors, capacitors, etc., also may be provided inside the substrate 10. The back gate 22A is, for example, a silicon (Si)-containing layer to which an impurity element is added.

Electrode layers 401D, 402D, 403D, and 404D on the drain side and electrode layers 401S, 402S, 403S, and 404S on the source side are stacked on the back gate 22A as an example in FIG. 1. Insulating layers (not shown) are provided between the electrode layers above and below.

The electrode layer 401D and the electrode layer 401S are provided in the same level and are the electrode layers of the first layer from the bottom. The electrode layer 402D and the electrode layer 402S are provided in the same level and are the electrode layers of the second layer from the bottom. The electrode layer 403D and the electrode layer 403S are provided in the same level and are the electrode layers of the third layer from the bottom. The electrode layer 404D and the electrode layer 404S are provided in the same level and are the electrode layers of the fourth layer from the bottom.

The electrode layer 401D and the electrode layer 401S are separated in the Y-direction. The electrode layer 402D and the electrode layer 402S are separated in the Y-direction. The electrode layer 403D and the electrode layer 403S are separated in the Y-direction. The electrode layer 404D and the electrode layer 404S are separated in the Y-direction.

Not-shown insulating layers are provided between the electrode layer 401D and the electrode layer 401S, between the electrode layer 402D and the electrode layer 402S, between the electrode layer 403D and the electrode layer 403S, and between the electrode layer 404D and the electrode layer 404S.

The electrode layers 401D, 402D, 403D, and 404D are provided between the back gate 22A and drain-side selection gate electrode layers 451D, 452D, and 453D. The electrode layers 401S, 402S, 403S, and 404S are provided between the back gate 22A and source-side selection gate electrode layers 451S, 452S, and 453S.

The number of layers of the electrode layers 401D, 402D, 403D, 404D, 401S, 402S, 403S, and 404S is arbitrary and is not limited to the four layers shown in FIG. 1. Also, in the embodiment, the electrode layers 401D, 402D, 403D, 404D, 401S, 402S, 403S, and 404S may be collectively referred to as simply the electrode layers WL. The electrode layers WL are, for example, conductive silicon-containing layers to which an impurity element such as boron (B), etc., is added.

The multiple drain-side selection gate electrode layers 451D, 452D, and 453D are provided on the electrode layer 404D via a not-shown insulating layer. The drain-side selection gate electrode layers 451D, 452D, and 453D are, for example, conductive silicon-containing layers to which an impurity is added. The source-side selection gate electrode layers 451S, 452S, and 453S are provided on the electrode layer 404S via a not-shown insulating layer. The source-side selection gate electrode layers 451S, 452S, and 453S are, for example, conductive silicon-containing layers to which an impurity is added. The number of layers of gate electrode layers is arbitrary and is not limited to the three layers shown in FIG. 1 (described below).

The drain-side selection gate electrode layer and the source-side selection gate electrode layer are separated in the Y-direction. The drain-side selection gate electrode layer and the source-side selection gate electrode layer may be generally referred to as selection gate electrode layers 45 without differentiating.

A source line 47 is provided on the source-side selection gate electrode layers 45 via a not-shown insulating layer. The source line 47 is connected to one of a pair of channel body layers 20 (semiconductor member). The source line 47 is a metal layer or a conductive silicon-containing layer to which an impurity is added.

Multiple bit lines 48 are provided on the drain-side selection gate electrode layers 45 and the source line 47 via a not-shown insulating layer. The bit line 48 is connected to the other of the pair of channel body layers 20. The bit line 48 extends in the Y-direction.

Memory holes MH having U-shaped configurations are multiply formed in the back gate 22A and in a stacked body 41 on the back gate 22A. The memory holes MH are through-holes prior to forming the channel body layers 20 and memory layers 30 (the memory films). For example, the memory holes MH that extend in the Z-direction are made in the electrode layers 401D to 404D and the drain-side selection gate electrode layers 45 to pierce the electrode layers 401D to 404D and the drain-side selection gate electrode layers 45. The memory holes MH that extend in the Z-direction are made in the electrode layers 401S to 404S and the source-side selection gate electrode layers 45 to pierce the electrode layers 401S to 404S and the source-side selection gate electrode layers 45. A pair of memory holes MH that extend in the Z-direction communicate with each other via a recess (a hollow portion) made in the back gate 22A to have a U-shaped configuration.

The channel body layer 20 is provided in a U-shaped configuration in the interior of the memory hole MH. The channel body layer 20 is, for example, a silicon-containing layer. The memory layer 30 is provided between the channel body layer 20 and the inner wall of the memory hole MH.

A gate insulator film 35 is provided between the channel body layer 20 and the drain-side selection gate electrode layers 45. A gate insulator film 36 is provided between the channel body layer 20 and the source-side selection gate electrode layers 45.

Drain-side selection transistors are formed of the drain-side selection gate electrode layers 45, the channel body layer 20, and the gate insulator film 35 between the channel body layer 20 and the drain-side selection gate electrode layers 45. The channel body layer 20 is connected to the bit line 48 above the drain-side selection transistors.

Source-side selection transistors are formed of the source-side selection gate electrode layers 45, the channel body layer 20, and the gate insulator film 36 between the channel body layer 20 and the source-side selection gate electrode layers 45. The channel body layer 20 is connected to the source line 47 above the source-side selection transistors.

A back gate transistor BGT is formed of the back gate 22A, the channel body layer 20 that is provided inside the back gate 22A, and the memory layer 30 that is provided inside the back gate 22A.

Memory cells MC having the electrode layers 401D to 404D as control gates are multiply provided between the back gate transistor BGT and the drain-side selection transistors. The memory cells MC are, for example, charge trap memory cells. Similarly, the memory cells MC having the electrode layers 401S to 404S as control gates are multiply provided between the back gate transistor BGT and the source-side selection transistors.

One memory string MS having a U-shaped configuration is formed of the multiple memory cells MC, the drain-side selection transistors, the back gate transistor BGT, and the source-side selection transistors that are connected in series by the channel body layer 20.

One memory string MS includes a pair of columnar portions CL that extend in the stacking direction of the stacked body 41 including the multiple electrode layers, and a linking portion 21 that is buried in the back gate 22A to link the pair of columnar portions CL. Multiple memory cells are provided three-dimensionally in the X-direction, the Y-direction, and the Z-direction by multiply arranging the memory strings MS in the X-direction and the Y-direction. Also, the nonvolatile semiconductor memory device 1 includes a controller 60 that performs the overall control of the nonvolatile semiconductor memory device 1. For example, the controller 60 controls the potentials applied to the multiple selection gate electrode layers 45 arranged vertically and each of multiple electrode layers 40 arranged vertically.

The controller 60 can control the potential (0 volt to several volts) applied to each of the drain-side selection gate electrode layers 451D, 452D, and 453D, and the source-side selection gate electrode layers 451S, 452S, and 453S independently.

Figure 2:
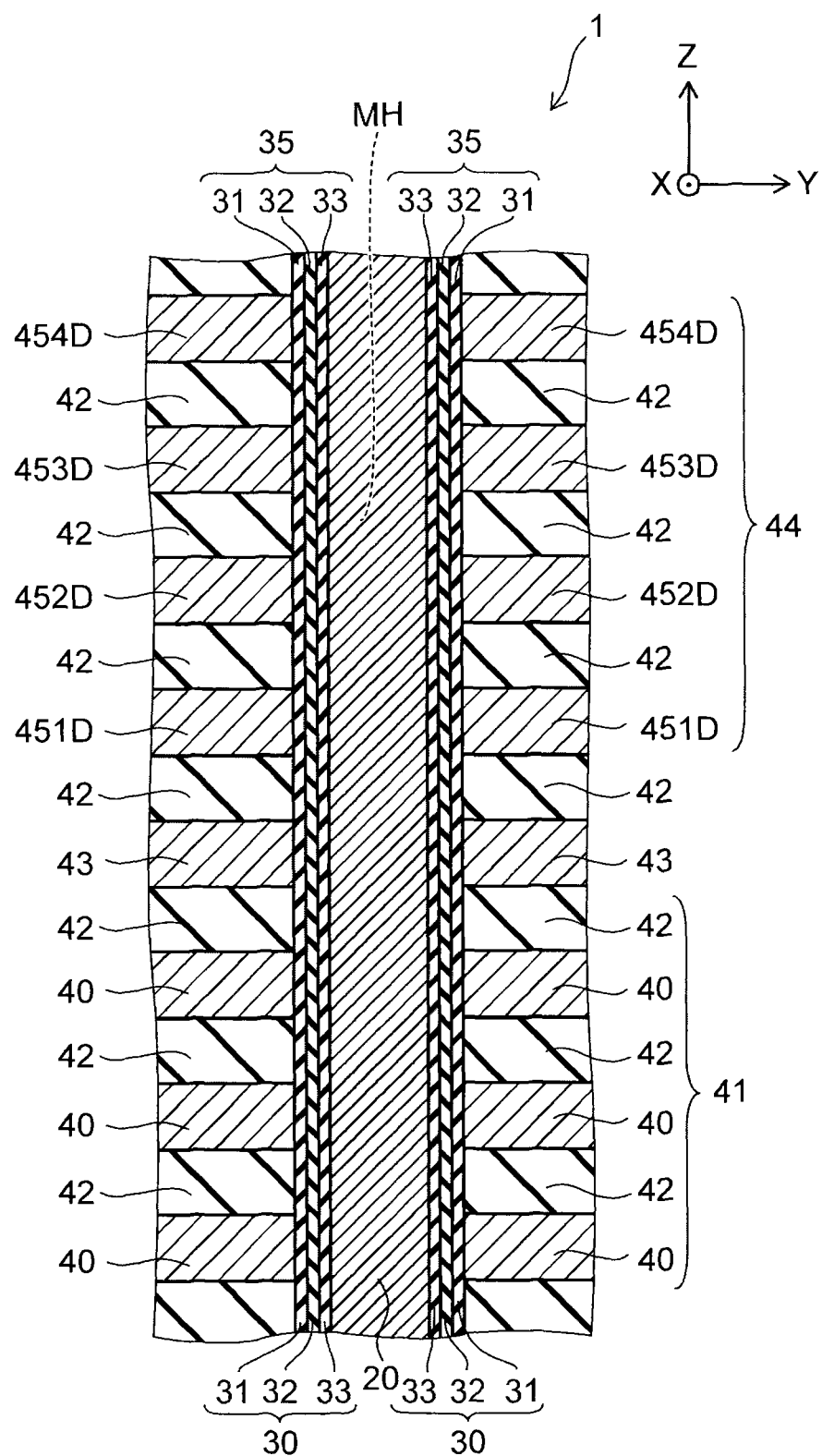
FIG. 2 is a schematic cross-sectional view showing selection gate electrode layers and a portion of the memory cells of the nonvolatile semiconductor memory device according to the embodiment.

FIG. 2 is a schematic cross-sectional view showing the selection gate electrode layers and a portion of the memory cells of the nonvolatile semiconductor memory device according to the embodiment.

The multiple selection gate electrode layers 451D, 452D, 453D, and 454D that are arranged vertically and a portion of the memory cells under the multiple selection gate electrode layers 451D, 452D, 453D, and 454D are shown in FIG. 2. Although the selection gate electrode layers 451D, 452D, 453D, and 454D on the drain side are shown in FIG. 2 as an example, these selection gate electrode layers may be source-side selection gate electrode layers. Further, FIG. 2 is an example; and the number of layers of multiple selection gate electrode layers arranged vertically is not limited to four.

The stacked body 41 that includes the multiple electrode layers 40 (first electrode layers) stacked alternately with multiple insulating layers 42 is provided on the foundation layer described above. The multiple selection gate electrode layers 451D, 452D, 453D, and 454D that are arranged in the stacking direction (the Z-direction) of the stacked body 41 are provided on the stacked body 41. In other words, the nonvolatile semiconductor memory device 1 includes selection gate electrode layers having a multilayered structure. The insulating layers 42 are provided between the multiple selection gate electrode layers. That is, a selection gate stacked body 44 that includes the multiple selection gate electrode layers 451D, 452D, 453D, and 454D stacked alternately with the multiple insulating layers 42 is provided on the stacked body 41.

The channel body layer 20 pierces the stacked body 41 and the selection gate stacked body 44 that includes the multiple selection gate electrode layers 451D, 452D, 453D, and 454D. The channel body layer 20 extends in the Z-direction.

The memory film 30 is provided between the channel body layer 20 and each of the multiple electrode layers 40. A blocking film 31, a charge storage film 32, and a tunneling film 33 are provided in the memory film 30 in order from the electrode layer 40 side. The blocking film 31 contacts the electrode layer 40; the tunneling film 33 contacts the channel body layer 20; and the charge storage film 32 is provided between the blocking film 31 and the tunneling film 33.

The charge storage film 32 includes many trap sites that trap charge. The charge storage film 32 is, for example, a silicon nitride film. Due to the existence of the tunneling film 33, a potential barrier occurs when charge is injected from the channel body layer 20 into the charge storage film 32 or when the charge that is stored in the charge storage film 32 diffuses into the channel body layer 20. The tunneling film 33 is, for example, a silicon oxide film. The blocking film 31 prevents the charge stored in the charge storage film 32 from diffusing into the electrode layer 40. The blocking film 31 is, for example, a silicon oxide film.

The channel body layer 20 functions as the channels of memory cell transistors. The electrode layers 40 function as control gate electrode layers. The charge storage film 32 functions as a data storage layer that stores the charge injected from the channel body layer 20. In other words, memory cells are provided at the intersections between the channel body layer 20 and the electrode layers 40.

The gate insulator film 35 is provided between the channel body layer 20 and each of the multiple selection gate electrode layers 451D, 452D, 453D, and 454D. For example, the gate insulator film 35 has the same structure and material as the memory film 30. For example, the blocking film 31, the charge storage film 32, and the tunneling film 33 are provided in the gate insulator film 35 in order from the electrode layer 40 side.

In the nonvolatile semiconductor memory device 1, multiple selection transistors are formed of the multiple selection gate electrode layers 451D, 452D, 453D, and 454D, the gate insulator film 35, and the channel body layer 20. At least two of the multiple selection transistors have mutually different threshold potentials. The threshold potentials (Vth) of the multiple selection transistors may be set to be substantially the same or substantially different from each other. For example, the threshold potential (Vth) is adjusted by the amount of charge stored in the charge storage film 32 of the gate insulator film 35.

For example, the controller 60 controls the potential (for example, positive potential) applied to one of the selection gate electrode layers 451D, 452D, 453D, and 454D. This potential is different from a potential applied to one of the electrode layers 40. Electrons are injected to the charge storage film 32 beside the selection gate electrode layer to which the positive potential is applied via the tunneling film 33 from the channel body layer 20. The controller 60 controls the amount of charge stored in the charge storage film 32 by changing the potential applied to each of the selection gate electrodes. As a result, at least two of the selection transistors have mutually different threshold potentials. The charge storage in the charge storage film 32 beside the selection gate electrode layer to which the positive potential is applied is performed before the memory cells are programmed or read.

Furthermore, the amount of charge stored in the charge storage film 32 beside each of the selection gate electrode layers can be changed by changing thickness of the charge storage film 32.

In the nonvolatile semiconductor memory device 1, an electrode layer 43 (a second electrode) that is not used as a selection gate or a control gate is provided between the multiple electrode layers 40 and the multiple selection gate electrode layers 451D, 452D, 453D, and 454D. The insulating layers 42 are provided above and below the electrode layer 43. The channel body layer 20 pierces the electrode layer 43. The gate insulator film 35 also is provided between the electrode layer 43 and the channel body layer 20. The electrode layer 43 may be omitted as appropriate.

FIG. 3A and FIG. 3B show threshold potentials and potentials applied in the off-state for the multiple selection transistors according to the embodiment.

The threshold potential V (Vth) is shown in FIG. 3A and FIG. 3B for the selection transistors that include the selection gate electrode layers 451D, 452D, 453D, and 454D and the transistor that includes the electrode layer 43. Also, the potential V (Bias) that is applied in the unselected state (in the off-state) of the memory string is shown in FIG. 3A and FIG. 3B for the electrode layer 43, the electrode layers 40, and the selection gate electrode layers 451D, 452D, 453D, and 454D. In the unselected state, for example, the controller 60 applies a potential V (Bias) (e.g., 8 V) to the electrode layers 40 that is higher than the potentials applied to the selection gate electrode layers 451D, 452D, 453D, and 454D.

The multiple selection transistors include a first selection transistor, and a second selection transistor disposed between the first selection transistor and the stacked body 41; and the threshold potential of the second selection transistor is set to be lower than the threshold potential of the first selection transistor. For example, in the example of FIG. 3A, the threshold potentials are different for each of the selection transistors including the selection gate electrode layers 451D, 452D, 453D, and 454D. For example, the threshold potentials are set to decrease from the selection gate electrode layer 454D of the uppermost layer toward the selection gate electrode layer 451D of the lowermost layer for the selection transistors including the multiple selection gate electrode layers 451D, 452D, 453D, and 454D.

In such a case, in the unselected state, the controller 60 applies a potential V (Bias) (e.g., −1 V) that is lower than the minimum value (e.g., 1 V) of the threshold potential (Vth) and is the same potential for each of the selection gate electrode layers 451D, 452D, 453D, and 454D.

In the example of FIG. 3B, the threshold potential (Vth) (e.g., 1 V) is the same for each of the selection transistors including the selection gate electrode layers 451D, 452D, 453D, and 454D.

In such a case, the controller 60 applies a different potential to the multiple selection gate electrode layers 451D, 452D, 453D, and 454D. The controller 60 applies a potential to the second selection gate electrode layer of the multiple selection gate electrode layers that is higher than the potential applied to the first selection gate electrode layer of the multiple selection gate electrode layers. For example, the controller 60 applies potentials V (Bias) to the selection gate electrode layers 451D, 452D, 453D, and 454D that are lower than the threshold potential (1 V). For example, the controller 60 applies the potentials V (Bias) so that the applied voltage increases from the selection gate electrode layer 454D of the uppermost layer toward the selection gate electrode layer 451D of the lowermost layer.

The potential that is applied to the electrode layer 43 by the controller 60 is a potential between the potential V (Bias) applied to the selection gate electrode layer 451D of the lowermost layer and the potential applied to the multiple electrode layers 40.

In the nonvolatile semiconductor memory device 1, potentials that are higher than the threshold potentials (Vth) to the selection gate electrode layers provided in the memory string are supplied to select the memory string to which the memory cell to be programmed belongs. And the programming of a prescribed memory cell is performed.

Here, it is controlled that programming due to channel boost does not occur by applying potentials that are lower than the threshold potentials to the selection gate electrode layers in the unselected cells that are not to be programmed, even if, for example, a potential of 8 V is supplied to the electrode layers 40.

The cut-off characteristic of the selection gate electrode layer is an important component in the unselected state. The cut-off characteristic is how difficult it is for the current ($I_{off}$) to flow in the channel body layer 20 in the unselected state. If the cut-off characteristic is good ($I_{off}$ is a minimum), misoperations of the programming are suppressed reliably.

For example, in a single-layer selection transistor that does not include multiple layers, there are cases where the threshold potential fluctuates and the cut-off characteristic is insufficient. Thereby, misprogramming may occur in the unselected state. For example, the thickness of the single-layer selection gate electrode layer is a thickness corresponding to the multiple selection gate electrode layers of the embodiment. Accordingly, there are cases where the memory hole MH made in the single-layer selection gate electrode layer has a tapered configuration or the hole diameter dimension of the memory hole MH fluctuates after the etching. Also, there are cases where the etched configuration is different for each selection gate electrode layer when the thick selection gate electrode layer is etched. Accordingly, the threshold potential fluctuates easily among the individual selection transistors or within the interior of the selection transistor for the single-layer selection gate electrode layer.

Moreover, the potential that is applied to the single-layer selection gate electrode layer in the unselected state is fixed to one potential. Then, the difference (the voltage) between the fixed potential and the potential applied to the electrode layers 40 is applied between the selection gate electrode layer and the electrode layer 40 of the uppermost layer. Accordingly, a strong electrical field is generated between the selection gate electrode layer and the electrode layer 40 of the uppermost layer.

Due to such a strong electrical field, there are cases where a current called GIDL (Gate induced Drain Current) flows in the channel body layer 20 at the selection gate electrode layer vicinity; and program disturbance degrades. Further, multi-bit recording distribution is negatively affected by the single-layer selection gate electrode layer.

Conversely, in the embodiment, multiple selection gate electrode layers are provided; potentials are applied to the multiple selection gate electrode layers; and the overdrive amount (the difference between the threshold voltage (Vth) and the potential (Bias)) is set in stages.

That is, in the nonvolatile semiconductor memory device 1 according to the embodiment, $I_{off}$ is suppressed for each of the multiple selection gate electrode layers; and each of the multiple selection gate electrode layers has a good cut-off characteristic. Thereby, misprogramming does not occur easily in the unselected state. Also, the discrepancies of the patterning by etching of the single-layer selection gate electrode layer do not occur.

In the embodiment, the electrode layer 43 is provided between the multiple electrode layers 40 and the selection gate electrode layer 451D of the lowermost layer. Here, the potential (e.g., 5 V) that is applied to the electrode layer 43 is a potential between the potential V (Bias) (e.g., 0.5 V) applied to the selection gate electrode layer 451D of the lowermost layer and the potential (e.g., 8 V) applied to the multiple electrode layers 40. In particular, in the example shown in FIG. 3B, the voltages V (Bias) that are applied to the multiple selection gate electrode layers 451D, 452D, 453D, and 454D gradually increase from the selection gate electrode layer 454D of the uppermost layer toward the electrode layer 40 of the uppermost layer. Further, the potential (e.g., 5 V) that is applied to the electrode layer 43 is a potential between the potential V (Bias) (e.g., 0.5 V) applied to the selection gate electrode layer 451D of the lowermost layer and the potential (e.g., 8 V) applied to the multiple electrode layers 40.

Accordingly, compared to the case of the single-layer selection gate electrode layer, the gradient of the electric field strength between the selection gate electrode layer 451D and the electrode layer 40 of the uppermost layer is relaxed. Thereby, the GIDL is not generated easily in the channel body layer 20 at the selection gate electrode layer vicinity; and misprogramming does not occur easily. Thus, the nonvolatile semiconductor memory device 1 has excellent reliability.

Figure 4:
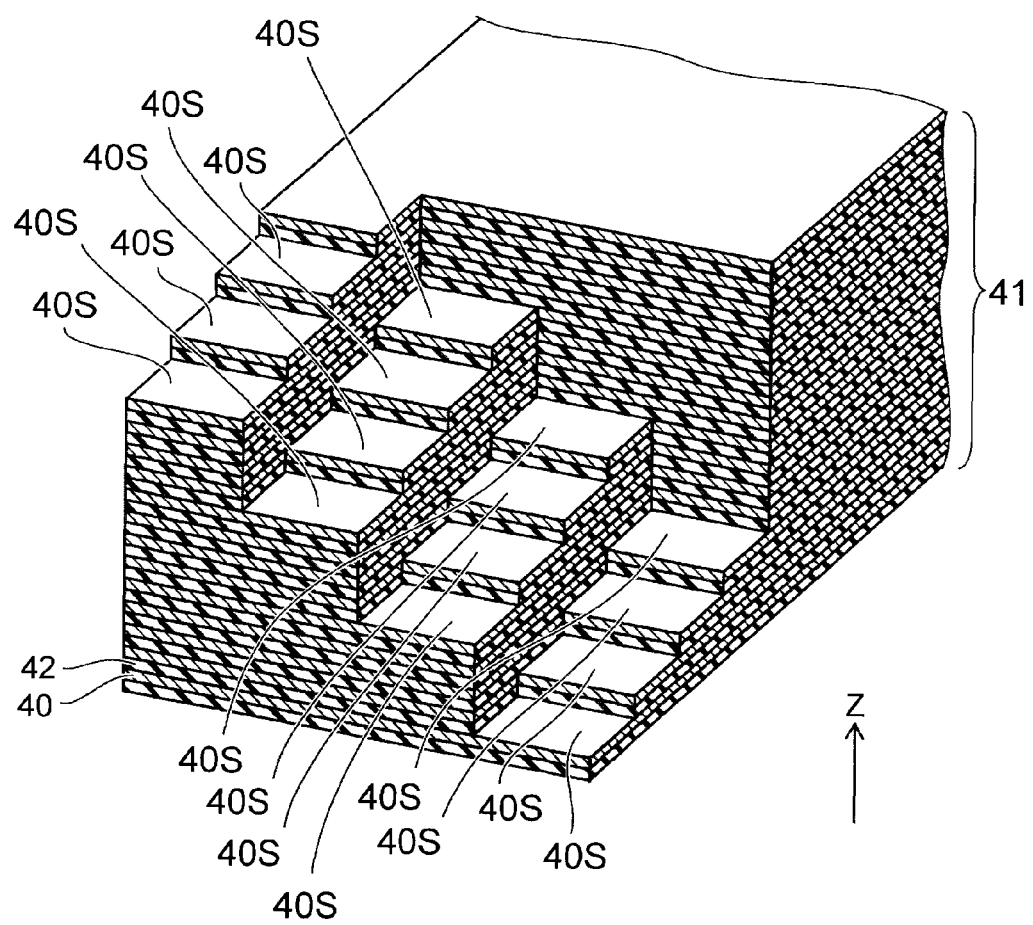
FIG. 4 is a schematic perspective view showing electrode layers according to the embodiment.

FIG. 4 is a schematic perspective view showing the electrode layers according to the embodiment.

At least one of the multiple electrode layers 40 stacked in the Z-direction other than the electrode layer 40 of the uppermost layer includes an exposed portion 40s. None of the multiple electrode layers 40 are provided on the exposed portion 40s. When the exposed portions 40s of the electrode layers 40 are viewed from the Z-direction, the exposed portions 40s of the electrode layers 40 are arranged in a chessboard-like configuration. The exposed portions 40s are arranged in a stairstep configuration.

By connecting contact interconnects (not shown) to the exposed portions 40s of the multiple electrode layers 40, the potentials V (Bias) can be supplied to the multiple electrode layers 40 via contact plugs.

Such exposed portions are utilized also in the case where contact interconnects are connected to the selection gate electrode layers of the multilayered structure.

Figure 5:
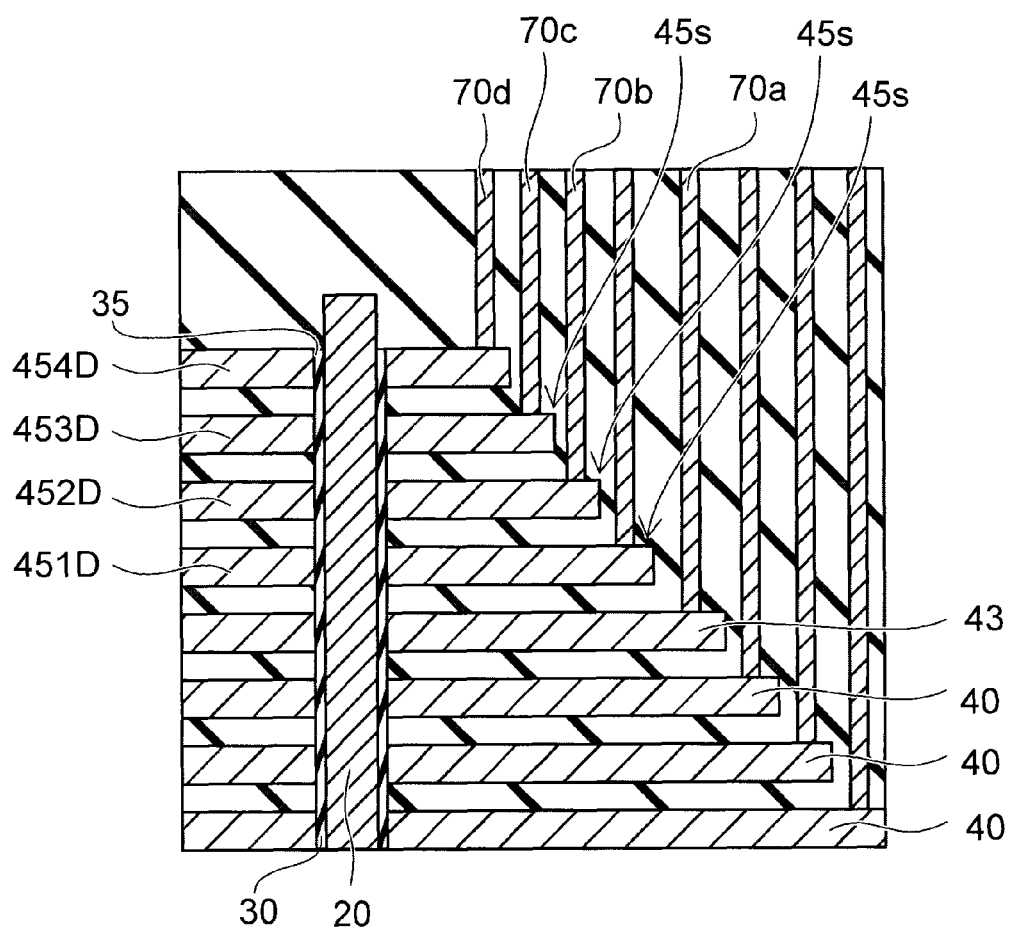
FIG. 5 is a schematic cross-sectional view showing contact plugs connected to the selection gate electrode layers of a multilayered structure according to the embodiment.

FIG. 5 is a schematic cross-sectional view showing the contact plugs connected to the selection gate electrode layers of the multilayered structure according to the embodiment.

For example, for the multiple selection gate electrode layers 451D, 452D, 453D, and 454D as shown in FIG. 5, at least one of the selection gate electrode layers 451D, 452D, or 453D, i.e., the selection gate electrode layers other than the selection gate electrode layer 454D of the uppermost layer, includes an exposed portion 45s. None of the multiple selection gate electrode layers are provided on the exposed portion 45s. Contact interconnects (contact plugs) 70a, 70b, 70c, and 70d are connected respectively to the selection gate electrode layers 451D, 452D, 453D, and 454D. Each of the contact interconnects 70a, 70b, 70c, and 70d is drawn out upward from the selection gate electrode layers. A portion of the contact interconnects 70a, 70b, 70c, and 70d is shown in FIG. 5.

Figure 6A:
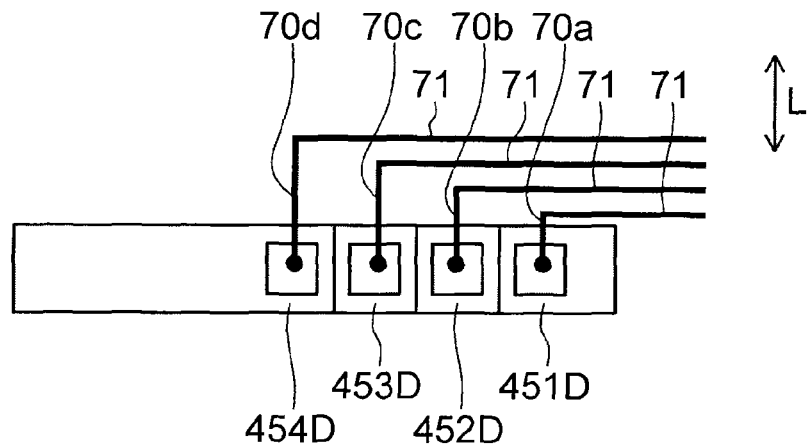
FIG. 6A to FIG. 6C are schematic plan views showing contact plugs connected to the selection gate electrode layers of the multilayered structure according to the embodiment.
Figure 6B:
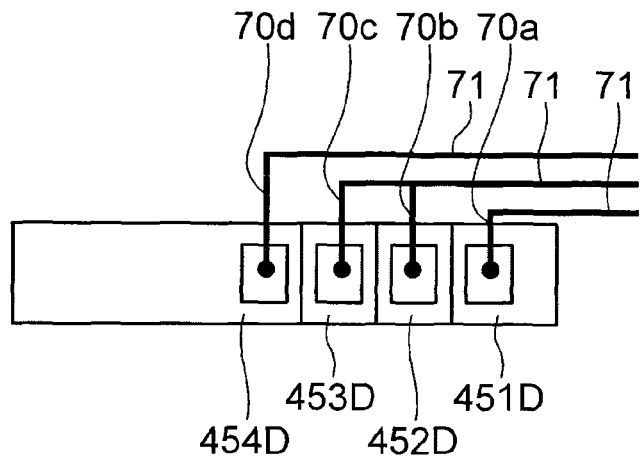
Figure 6C:
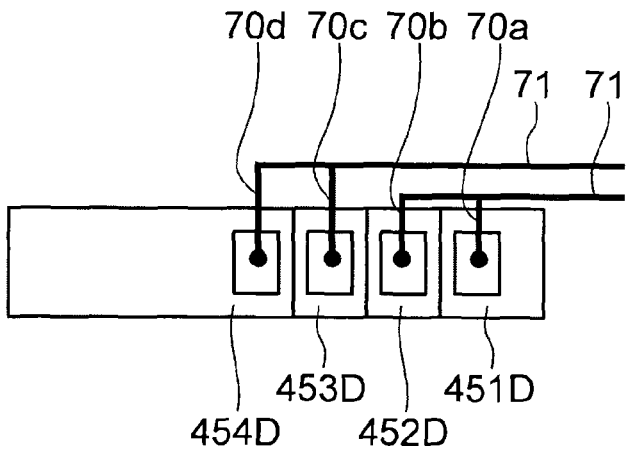

Configurations of the connections of the contact interconnects 70a, 70b, 70c, and 70d that are drawn out upward are shown in FIG. 6A to FIG. 6C.

FIG. 6A to FIG. 6C are schematic plan views showing the contact plugs connected to the selection gate electrode layers of the multilayered structure according to the embodiment.

For example, FIG. 6A shows a first example when the state of FIG. 5 is viewed from the upper surface. In the state of FIG. 6A, interconnects 71 are connected respectively to the contact interconnects 70a, 70b, 70c, and 70d. The interconnects 71 are drawn out to a peripheral circuit.

FIG. 6B shows a second example when the state of FIG. 5 is viewed from the upper surface. In the state of FIG. 6B, the interconnects 71 are connected respectively to the contact interconnects 70a and 70d. However, the contact interconnects 70b and 70c are connected to a common interconnect 71.

FIG. 6C shows a third example when the state of FIG. 5 is viewed from the upper surface. In the state of FIG. 6C, the contact interconnects 70d and 70c are connected to a common interconnect 71. Also, the contact interconnects 70b and 70a are connected to a common interconnect 71.

In other words, the contact interconnects that are connected to at least two of the multiple selection gate electrode layers are connected to the same interconnect 71.

Here, in the case where the block length of the nonvolatile semiconductor memory device 1 is set to be in the direction illustrated by arrow L, the increase of the block length can be suppressed by reducing the number of interconnects 71. In other words, in the nonvolatile semiconductor memory device 1, even in the case where the selection gate electrode layers have a multilayered structure, the increase of the block length can be suppressed by connecting at least two of the multiple selection gate electrode layers to contact interconnects that are connected to the same interconnect 71. In the state of FIG. 6A, for example, the increase of the block length L can be suppressed by arranging the interconnects 71 vertically. Other than arranging the multiple interconnects 71 in the X-direction (or the Y-direction), the multiple interconnects 71 may be stacked in the Z-direction. The increase of the block length L also can be suppressed by stacking the multiple interconnects 71 in the Z-direction.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device, comprising:
   a foundation layer;
   a stacked body provided on the foundation layer, the stacked body including a plurality of first electrode layers stacked alternately with a plurality of first insulating layers;
   a selection gate stacked body provided on the stacked body, the selection gate stacked body including a plurality of selection gate electrode layers stacked alternately with a plurality of second insulating layers in a stacking direction of the stacked body;
   a semiconductor member provided inside the stacked body and inside the selection gate stacked body to extend in the stacking direction;
   a memory film provided between the semiconductor member and one of the plurality of first electrode layers;
   a gate insulator film provided between the channel body film and one of the plurality of selection gate electrode layers, the gate insulator film including a charge storage film; and
   a controller capable of controlling to apply a potential to each of the plurality of selection gate electrode layers,
   a plurality of selection transistors being provided on the stacked body, one of the plurality of selection transistors including the gate insulator film, the semiconductor member, and one of the plurality of selection gate electrode layers,
   the stacked body having a plurality of memory cells, one of the memory cells including the semiconductor member, the memory film, and one of the plurality of first electrode layers, the plurality of memory cells being unselected by the plurality of selection transistors at programming.

2. The device according to claim 1, wherein each of the plurality of selection transistors has the same threshold potential.

3. The device according to claim 1, wherein
   the plurality of selection gate electrode layers include a first selection gate electrode layer, and a second selection gate electrode layer disposed between the first selection gate electrode layer and the stacked body, and
   the controller is capable of applying a second potential to the second selection gate electrode layer, the second potential being higher than a first potential applied to the first selection gate electrode layer.

4. The device according to claim 3, wherein each of the plurality of selection transistors has the same threshold potential.

5. The device according to claim 1, wherein the controller is capable of applying potentials to the plurality of selection gate electrode layers, the potentials being set to increase from the selection gate electrode layer of the uppermost layer of the plurality of selection gate electrode layers toward the selection gate electrode layer of the lowermost layer of the plurality of selection gate electrode layers.

6. The device according to claim 5, wherein each of the plurality of selection transistors has the same threshold potential.

7. The device according to claim 1, further comprising contact interconnects connected to the plurality of selection gate electrode layers,
    at least two layers of the plurality of selection gate electrode layers being connected by the contact interconnects to the same interconnect.

8. The device according to claim 1, wherein the controller independently controls to apply a potential to each of the plurality of selection gate electrode layers.

9. The device according to claim 1, wherein the number of the plurality of selection gate electrode layers is at least three, at least two layers of the plurality of selection gate electrode layers are electrically connected to each other, at least two potentials applied to the plurality of selection gate electrode layers are different from each other.

10. The device according to claim 1, wherein the number of the plurality of selection gate electrode layers is at least four, at least two layers of the plurality of selection gate electrode layers are electrically connected to each other, at least three potentials applied to the plurality of selection gate electrode layers are different from each other.

11. The device according to claim 1, wherein a potential applied to the plurality of first electrode layers is larger than a potential applied to the plurality of selection gate electrode layers.

\* \* \* \* \*